(12) United States Patent
Mainguet et al.

(10) Patent No.: US 10,489,625 B2
(45) Date of Patent: Nov. 26, 2019

(54) THERMAL PATTERN SENSOR WITH SHARED HEATING ELEMENTS

(71) Applicants: COMMISSARIAT A L'ENERGIE ATOMIQUE ET AUX ENERGIES ALTERNATIVES, Paris (FR); IDEMIA IDENTITY & SECURITY FRANCE, Issy-les-Moulineaux (FR)

(72) Inventors: Jean-Francois Mainguet, Grenoble (FR); Joel Yann Fourre, Marly le Roi (FR)

(73) Assignees: COMMISSARIAT A L'ENERGIE ATOMIQUE ET AUX ENERGIES ALTERNATIVES, Paris (FR); IDEMIA IDENTITY & SECURITY FRANCE, Issy-les-Moulineaux (FR)

( * ) Notice: Subject to any disclaimer, the term of this patent is extended or adjusted under 35 U.S.C. 154(b) by 33 days.

(21) Appl. No.: 15/662,778

(22) Filed: Jul. 28, 2017

(65) Prior Publication Data

US 2018/0032781 A1 Feb. 1, 2018

(30) Foreign Application Priority Data

Jul. 29, 2016 (FR) ...................... 16 57389

(51) Int. Cl.
*G06K 9/00* (2006.01)
*G01R 19/10* (2006.01)
(Continued)

(52) U.S. Cl.
CPC .............. *G06K 9/0002* (2013.01); *G01J 5/34* (2013.01); *G01R 19/10* (2013.01); *G01R 19/32* (2013.01);
(Continued)

(58) Field of Classification Search
CPC .......... G06K 9/0002; G01J 5/046; G01J 5/34; A61B 5/1172
See application file for complete search history.

(56) References Cited

U.S. PATENT DOCUMENTS

| 4,394,773 A | 7/1983 | Ruell |
| 4,429,413 A | 1/1984 | Edwards |
(Continued)

FOREIGN PATENT DOCUMENTS

EP 2 385 486 A1 11/2011

OTHER PUBLICATIONS

U.S. Appl. No. 15/662,805, filed Jul. 28, 2017, Mainguet et al.
(Continued)

*Primary Examiner* — John B Strege
(74) *Attorney, Agent, or Firm* — Oblon, McClelland, Maier & Neustadt, L.L.P.

(57) ABSTRACT

A thermal pattern sensor is provided, including a matrix of several lines and columns of pixels, each pixel including at least one pyroelectric capacitance formed by at least one portion of pyroelectric material arranged between a lower electrode and an upper electrode; wherein one of the lower and upper electrodes forms a reading electrode of the pixels; and a plurality of electrically conductive portions, each being configured for Joule effect heating, independently of other portions of the plurality, of the at least one portion of pyroelectric material of the at least one pyroelectric capacitance of pixels of at least two adjacent lines of pixels associated with the each electrically conductive portion, and each being arranged facing at least a part of a surface of the reading electrode of each of the pixels of the at least two adjacent lines of pixels associated with the each electrically conductive portion.

16 Claims, 3 Drawing Sheets

(51) Int. Cl.
*G01R 19/32* (2006.01)
*H03K 17/94* (2006.01)
*H03K 17/96* (2006.01)
*G01J 5/34* (2006.01)

(52) U.S. Cl.
CPC ......... H03K 17/941 (2013.01); H03K 17/962 (2013.01)

(56) References Cited

U.S. PATENT DOCUMENTS

| | | | |
|---|---|---|---|
| 4,948,963 A * | 8/1990 | Ballingall | H01L 27/14649 250/332 |
| 5,818,043 A * | 10/1998 | Buchy | G01J 5/20 250/332 |
| 6,091,837 A | 7/2000 | Dinh | |
| 6,289,114 B1 | 9/2001 | Mainguet | |
| 8,801,274 B2 | 8/2014 | Mainguet et al. | |
| 2006/0050935 A1 | 3/2006 | Bustgens et al. | |
| 2007/0147608 A1 * | 6/2007 | Mainguet | G06F 7/588 380/46 |
| 2011/0280276 A1 | 11/2011 | Mainguet et al. | |
| 2015/0253363 A1 | 9/2015 | Troccoli | |
| 2016/0200091 A1 * | 7/2016 | Mizukoshi | H05K 3/1225 101/123 |

OTHER PUBLICATIONS

U.S. Appl. No. 14/583,967, filed Dec. 29, 2014, Mainguet et al.
U.S. Appl. No. 15/445,235, filed Feb. 28, 2017, Mainguet et al.
French Preliminary Search Report dated Apr. 7, 2017 in French Application 16 57389 filed on Jul. 29, 2016 (with English Translation of Categories of cited documents).
U.S. Appl. No. 14/583,967, filed Dec. 29, 2014, 2015/0191309 A1, Jean-Francois Mainguet, et al.
U.S. Appl. No. 15/445,235, filed Feb. 28, 2017, Sebastien Becker, et al.

* cited by examiner

THERMAL PATTERN SENSOR WITH SHARED HEATING ELEMENTS

TECHNICAL FIELD AND PRIOR ART

The invention relates to a thermal pattern sensor wherein the heating elements are shared so that each of the heating elements is capable of heating several lines of pixels. This thermal pattern sensor advantageously corresponds to a fingerprint detector that uses thermal detection.

A fingerprint detector comprises means of thermal detection. These means of thermal detection may correspond to pyroelectric elements, diodes, thermistors or any other temperature-sensitive elements which can convert a temperature variation into an electrical potential or current variation.

Detection of a fingerprint may be performed by so-called "passive" sensors which use temperature differences between the finger and the sensor, as described in documents U.S. Pat. Nos. 4,394,773, 4,429,413 and 6,289,114. These sensors have the drawback, however, of making a measurement which depends solely upon the temperature difference between the finger and the sensor. The level of the signal obtained may therefore be zero when the finger and the sensor are at the same temperature (for example when the finger remains on the sensor for a certain time), or the contrast of the detected images may vary and therefore cause problems during later processing of the images.

In order to eliminate the problems that arise with passive thermal sensors, in particular in the case of static acquisition where the finger does not move, so-called "active" fingerprint sensors have been proposed such as, for example, those described in documents U.S. Pat. No. 6,091,837 and EP 2 385 486 A1. In such a sensor, each pixel comprises a pyroelectric capacitance formed from two conductive electrodes, between which a portion of pyroelectric material is placed, and a heating element. This heating element dissipates a certain amount of heat into the pixel, and the heating of the pixel is measured at the end of a certain acquisition time, called the integration time, with the finger present on the sensor. This allows the presence of a peak (ridge) or a valley to be detected at each pixel, according to whether the heat is absorbed by the skin (when there is a peak of the print present at the pixel) or retained in the pixel (when there is a valley of the print present at the pixel). This results in a lower final temperature in the case of a peak present at the pixel, where the heat is absorbed by the skin, compared with a pixel where a valley is present.

Such a sensor primarily measures the heat capacity, also known as the specific heat or specific heat capacity, of an element in contact with the sensor. The measurements obtained also depend on the thermal conductivity between the sensor and the part of the element (peak or valley in the case of a fingerprint) facing it.

In order to form an active thermal sensor, the pixels of this sensor are coupled to heating elements which usually use the Joule effect and which dissipate heat from a resistance element through which a current passes. One of levels of the technological stack forming the pixels is advantageously used to form these heating elements. For example, it is possible to use one of the electrically conductive levels used to create the sensor's transistors and interconnections if one of these levels comprises a conductive material which exhibits a suitable resistivity and on which one of the voltages already available is applied, for example the sensor supply voltage, in order to generate Joule effect heating. This is used in particular when the sensor comprises Thin Film Transistor (TFT) type transistors, made on a glass or plastic substrate.

The pixels of such a sensor are arranged by forming a matrix of several lines and of several columns. The pixels are usually read line-by-line. The heating elements may then also be controlled a line at a time using a transistor located at the head of each line, thus avoiding having to add control transistors in each of the pixels. Each line of heating elements is, for example, connected on one side of the pixels matrix to ground and on the other side to the control transistor associated with the line of pixels and which is connected to a supply capable of controlling the current passing through the heating elements, and therefore the Joule effect thermal power introduced into the pixels by these heating elements.

In order to take a reading of the variation in the number of electrical charges appearing in the pyroelectric capacitances of the pixels of one of the lines of pixels of the active thermal sensor, the line of heating elements associated with the line of pixels being read is activated by passing a heating current in this line of heating elements. Each of the pixels comprises at least one selection transistor, and the selection transistors of the pixels of each column of pixels are connected to a conductive line, itself connected to a reading circuit. During reading of a line of pixels the selection transistors of the pixels of this line are set to an ON state (conducting state), which allows the active nodes of the pixels of this line to be connected to the reading circuits located at the end of each of the column of pixels. The non-conducting selection transistors of the pixels belonging to the other lines of pixels prevent the movement of charge from these other pixels to the reading circuits. Other transistors may also be present in each pixel, in particular when the pixels voltages are being read and they require a re-initialisation transistor and a voltage follower transistor, or when the sensor also forms an optical sensor wherein a transistor is present in each pixel to connect a photodiode of each pixel to a dedicated reading circuit.

When the sensor is made with TFT type transistors, the transistors are made using lithography techniques, allowing them to be produced with good resolution. The pyroelectric material is then deposited and then the upper electrodes of the pyroelectric capacitances are made. The heating elements must then be made.

It would be advantageous to be able to make the upper electrodes and the heating elements, in particular for a sensor made using TFT technology, using printing (rotogravure, offset gravure, screen-printing etc.) given the low implementation costs of these printing techniques. The resolutions that can be achieved with these techniques are, however, incompatible with the resolutions sought for certain thermal pattern sensors, for example fingerprint sensors comprising pixels with a spacing of about 50.8 µm in the case of a sensor with a resolution equal to 500 dpi ("dots per inch").

DESCRIPTION OF THE INVENTION

Thus there is a need to propose a thermal pattern sensor which comprises heating elements which are compatible with manufacture using printing, whilst still allowing good pixel resolution to be achieved.

To this end one embodiment proposes a thermal pattern sensor which comprises a matrix of several lines and several columns of pixels, each pixel comprising at least one pyroelectric capacitance formed by at least one portion of pyroelectric material arranged between a lower electrode and an upper electrode, wherein a first of the lower and upper electrodes forms an electrode for reading the pixel, and which moreover comprises a plurality of electrically conductive portions, each capable of heating by means of the Joule effect, independently of the other electrically conductive portions, of the portions of pyroelectric material of the pyroelectric capacitances of the pixels of at least two adjacent lines of pixels associated with the electrically conductive portion, and arranged facing at least a part of the surface of the reading electrodes of each of the pixels of the lines associated with the electrically conductive portion.

In this sensor, each of the electrically conductive portions therefore forms the heating element of at least two adjacent lines of pixels. Thus the resolution required for the creation of these electrically conductive portions is reduced by a factor equal to at least two, compared with the resolution of the pixels.

In such a sensor, the electrically conductive portions forming the heating elements may therefore be made using techniques which do not allow a resolution equal to that of the pixels of the sensor to be achieved, for example by printing.

The element comprising the thermal pattern that is to be detected by the sensor is intended to be in physical contact with the sensor, i.e. placed against the sensor during the detection of this thermal pattern.

Each of the electrically conductive portions may be arranged facing a part of the surface of the reading electrode of each of the pixels of the lines associated with the electrically conductive portion, where the surface areas of the pixels' reading electrodes located facing the electrically conductive portions may be substantially equal to each other. Thus, although the electrically conductive portions forming the heating elements do not fully cover the pixels' reading electrodes, similar heating between all pixels heated by such an electrically conductive portion is achieved as a result of the identical coverage of the reading electrodes of these pixels by the electrically conductive portion.

According to a first embodiment, the thermal pattern sensor may be such that:
  each pixel moreover comprises a selection transistor connected to the reading electrode of said pixel,
  for each line of pixels, the gates of the selection transistors for said line of pixels are connected to a selection line of said line of pixels,
  for each column of pixels, the selection transistors of the pixels of said column of pixels are connected to a reading column of said column of pixels which is connected to a reading circuit common to the pixels of said column of pixels.

In this case the thermal pattern sensor may moreover comprise a control circuit capable of implementing at least the following steps for reading a line of pixels:
  setting the selection transistors of the pixels of said line to an ON state;
  application of a heating voltage to the ends of the electrically conductive portion associated with said line of pixels;
  re-initialisation of the reading circuits;
  waiting during an integration time which corresponds to the measurement of the thermal pattern by the pixels of said line;
  reading of the quantity of electric charge received by the reading circuits;
  setting the selection transistors of the pixels of said line to an OFF state (non-conducting state).

The step for reading the quantity of electric charge received by the reading circuits may be followed by a step for shutting-off application of the heating voltage to the ends of the electrically conductive portion associated with said line of pixels.

Furthermore, the control circuit may be capable of controlling the successive reading of several lines of pixels such that two lines of pixels read successively are associated with different electrically conductive portions. Thus it is not necessary to meet requirements for a cooling period between two lines of pixels being read successively since the second line of pixels being read is not heated by the same electrically conductive portion as that heating the line of pixels read previously.

According to one specific embodiment the electrodes for reading the pixels of a given column, and which belong to two adjacent lines of pixels associated with different electrically conductive portions, may be electrically connected to each other. This configuration allows the number of selection transistors and the number of selection lines necessary to carry out reading of the sensor pixels to be reduced.

Alternatively, it is nevertheless possible to successively read two lines of pixels associated with the same electrically conductive portion carrying out the heating of these two lines of pixels. In this case the requirement for a waiting time between reading and these two lines of pixels must be met.

According to a second embodiment, it is possible for the thermal pattern sensor to be such that:
  each pixel moreover comprises at least one selection transistor connected to the reading electrode of said pixel,
  the gates of the selection transistors of the pixels belonging to adjacent lines of pixels capable of being heated simultaneously by a given electrically conductive portion are connected to a single common selection line for said lines of pixels,
  for each column of pixels, the selection transistors whose gates are connected to the same selection line are connected to different reading columns, each connected to a different reading circuit.

Compared to the first embodiment, the sensor according to this second embodiment comprises a greater number of reading columns, as well as a greater number of reading circuits. Due to the fact that the lines of pixels heated by a given electrically conductive portion may be read simultaneously, the reading of the pixels is simplified, and there is no further need to comply with a requirement for a waiting time between two successive readings of two lines of pixels associated with a given electrically conductive portion carrying out the heating of these two lines of pixels.

In this case the thermal pattern sensor may moreover comprise a control circuit capable of implementing at least the following steps for simultaneous reading of adjacent lines of pixels capable of being heated simultaneously by the same electrically conductive portion:
  setting the selection transistors of the pixels of said lines to an ON state;
  application of a heating voltage to the ends of the electrically conductive portion associated with said lines of pixels;
  re-initialisation of the reading circuits;
  waiting during an integration time which corresponds to the measurement of the thermal pattern by the pixels of said lines of pixels;
  reading of the quantity of electric charge received by the reading circuits;

setting the selection transistors of the pixels of said lines to an OFF state.

The step for reading the quantity of electric charge received by the reading circuits may be followed by a step for shutting off the application of the heating voltage to the ends of the electrically conductive portion associated with said lines of pixels.

During the reading of a line of pixels, the control circuit may be capable of applying at least one second non-zero heating voltage to the ends of at least one electrically conductive portion adjacent to the electrically conductive portion associated with the line of pixels being read. Thus the heat generated by the electrically conductive portion adjacent to the electrically conductive portion associated with the line of pixels being read contributes to the heating of the line of pixels being read. The phenomenon of diathermy is therefore judiciously used here to introduce more heat into the line of pixels being read and thus obtain reading larger signals from the pixels being read.

In this case, the heating carried out by the other electrically conductive portion or portions found next to the line of pixels being read may be implemented such that the heating power dissipated by this or these other electrically conductive portion or portions is less than that dissipated by the electrically conductive portion associated with the line of pixels being read. In this case the heat is primarily provided by the electrically conductive portion associated with the line of pixels being read and not by the lateral heating produced by the other electrically conductive portion or portions. This control over the heat provided to the line of pixels being read limits the undesirable effects of diathermy.

The sensor may moreover comprise a substrate on which the pyroelectric capacitances of the pixels are arranged, where the lower electrode of the pyroelectric capacitance of each pixel forms the reading electrode of the pixel and is arranged between the substrate and the portion of the pyroelectric material of the pyroelectric capacitance of the pixel.

In this case the electrically conductive portions may form the upper electrodes of the pyroelectric capacitances of the pixels, that is, the electrodes closest to the surface of the sensor upon which the element whose thermal pattern is being measured is found.

The upper electrodes of the pyroelectric capacitances of the pixels may be formed by a second electrically conductive layer common to all the pixels in the matrix, capable of being electrically connected to a reference electrical potential and arranged between the electrically conductive portions and the reading electrodes. This alternative is advantageous since it provides an arrangement of the electrically conductive portions forming the heating elements close to the element whose thermal pattern is to be detected that is present on the sensor.

The reading electrodes of the pixels may be formed by distinct elements of electrically conductive material which are electrically insulated from each other.

Advantageously the thermal pattern sensor may be an active thermal fingerprint sensor made on a flexible substrate with transistors of the TFT type comprising IGZO. The lower electrodes may be made above the transistors, during the lithography steps forming the sensor electrodes. This allows these lower electrodes to be made with a high resolution. The pyroelectric material is deposited on the lower electrodes. The upper electrodes, advantageously formed by electrically conductive portions corresponding to the heating elements of the pixels, are advantageously made on the pyroelectric material by the implementation of low cost printing techniques.

Finally, another embodiment also relates to a method for making a thermal pattern sensor such as previously described wherein the electrically conductive portions are made by printing.

BRIEF DESCRIPTION OF THE ILLUSTRATIONS

The present invention will be better understood on reading the description of example embodiments given, purely as an indication and in no sense restrictively, making reference to the appended illustrations in which.

Identical, similar or equivalent parts of the various figures described hereafter have the same numerical references, to make it easier to move from one figure to another.

In order to make the figures more readable, the various parts shown in the figures are not necessarily shown at a uniform scale.

The various possibilities (alternative variants and embodiments) must be understood as not being mutually exclusive, and as being capable of being combined with one another.

DETAILED DESCRIPTION OF SPECIFIC EMBODIMENTS

Figure 1:
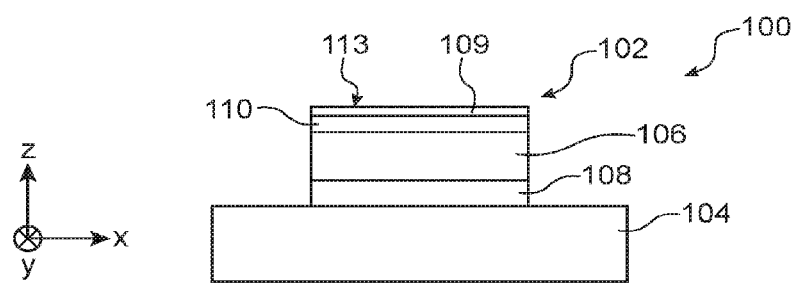
FIG. 1 shows a section view of a pyroelectric capacitance of a pixel of a thermal pattern sensor.

With reference first of all to FIG. 1, which shows a section view of a pyroelectric capacitance of a pixel 102, which forms the thermo-sensitive measurement element of the pixel 102, of a thermal pattern sensor 100.

The sensor 100 comprises a substrate 104 which corresponds, for example, to a glass substrate or a semi-conductor substrate (for example silicon). A glass substrate 104 may be used when the sensor 100 is made using TFT transistors, whereas a substrate 104 comprising a semi-conductor, for example silicon, may be used when the sensor 100 comprises transistors made using MOS technology. The substrate 104 may also be a flexible substrate comprising, for example, polyimide or PEN (polyethylene naphthalate) or PET (polyethylene terephthalate), on which the electronic elements of the sensor 100, such as TFT transistors, are made using printed electronics technology (for example by being made using printing heads of the ink-jet type) or by lithographic printing.

The transistors made on the substrate 104 and on which the pixels 102 are made are not shown in FIG. 1.

The pixels 102 of the sensor 100 are made on the substrate 104 by forming a matrix of several lines and of several columns of pixels 102. The spacing of the pixels 102 (corresponding to the spacing between the centres of two adjacent pixels) in the (X,Y) plane (that is, in the plane of the substrate 104) is, for example, between about 25 µm and 100 µm. In the case of a sensor 100 with a resolution equal to 500 dpi, the spacing of the pixels 102 is equal to 50.8 µm.

Each of the pixels 102 of the sensor 100 comprises thermo-sensitive means of measurement or of detection formed by a pyroelectric capacitance. Each pyroelectric capacitance comprises a portion 106 of pyroelectric material arranged between a lower electrode 108 and an upper electrode 110. The pyroelectric material of the portion 106 is advantageously P(VDF-TrFE) or PVDF. Alternatively the pyroelectric material of the portion 106 may be AlN or PZT, or any other pyroelectric material capable of forming a pyroelectric capacitance. The thickness of the portion 106 is, for example, between about 500 nm and 10 μm.

The electrodes 108, 110 each comprise at least one electrically conductive material, for example a metallic material such as titanium with a thickness equal to about 0.2 μm, and/or molybdenum and/or aluminium and/or a conductive oxide such as ITO (indium tin oxide) and/or a conductive polymer of thickness, for example, equal to several microns, for example about 4 μm. One of the electrodes 108, 110, advantageously the upper electrode 110, or each of the two electrodes 108, 110, may be formed from a stack of several electrically conductive materials, for example a Ti/TiN/AlCu stack. The thickness of each of the electrodes 108, 110 is, for example, between about 0.1 μm and 1 μm. The thickness of each of the electrodes 108, 110 may be greater, up to for example about 5 μm, in particular when these electrodes are made by printing using materials such as silver, copper, carbon or PEDOT (poly(3,4-ethyl-enedioxythiophene)

A protective layer 109 corresponding, for example, to a layer of aluminium nitride or of any other material capable of creating this layer, covers the upper electrode 110. The thickness of the protective layer 109 may be between a few microns and about 100 μm, or much greater (for example of the order of 300 μm or more). An upper face 113 of the protective layer 109 corresponds to the surface upon which the thermal pattern to be detected is found, for example a finger whose fingerprint is to be detected.

For the PVDF of the portion 106 to acquire its pyroelectric (and also piezoelectric) properties, this material is subjected, once for the entire lifetime of the pyroelectric capacitance, to an electric field of about 100 volts per micron thickness of PVDF. The molecules inside the PVDF are aligned and remain thus aligned even when the PVDF is no longer subjected to an electric field. The PVDF may thus be polarised by applying an initial polarisation voltage to the terminals of the electrodes 108, 110.

After this initial polarisation, when the portion 106 is subjected to a temperature variation $\Delta T$, this temperature variation $\Delta T$ causes an additional electric field to be produced, which generates charges $\Delta Q$ between the electrodes 108, 110 such that:

$$\Delta Q = S \cdot \gamma \cdot \Delta T$$

The parameter S corresponds to the surface area of the portion 106 facing each of the electrodes 108, 110. The parameter $\gamma$ corresponds to the pyroelectric coefficient of the pyroelectric material of the portion 106. For example the pyroelectric coefficient $\gamma$ of the PVFD-TrFE is equal to about 32 $\mu C/m^2/K$.

Since the portion 106 and the electrodes 108, 110 form a capacitance of value C to which are added stray, or parasitic, capacitances Cp, the charges $\Delta Q$ produced induce an electrical potential difference $\Delta V$ between the electrodes 108, 110 such that:

$$(C+C_p) \cdot \Delta V = \Delta Q = S \cdot \gamma \cdot \Delta T$$

In addition to the charges generated by the capacitance of value C, other stray, or parasitic, charges may also be generated via the stray capacitances Cp that are present, for example those associated with the reading transistor gate in the case of a voltage reading circuit.

When the potential of the reading electrode (formed by one of the electrodes 108, 110) is fixed (so called "current"

reading), the charges generated flow towards the reading circuit forming an integrated current at the outlet, where, in this case:

$$\frac{\Delta Q}{\zeta} = \frac{S \cdot \gamma \cdot \Delta T}{\zeta}.$$

where $\zeta$ corresponds to the integration time during which the measurement is made by the pixel. The advantage of current reading is that it is insensitive, to a first approximation, to the values of the capacitances, in particular to stray capacitances.

The sign of the electrical voltage $\Delta V$ obtained between the electrodes 108, 110, or the direction of the current in the case of current reading, depends on the direction of the electric field by means of which the PVDF of 106 was initially polarised. In the case of certain other pyroelectric materials such as aluminium nitride, this initial polarisation direction depends on how the pyroelectric material has been deposited, on its order and on its crystallographic orientation. Moreover, the electrical voltage $\Delta V$ obtained, or the direction of the current, may be positive or negative depending on whether the variation in the temperature that the pyroelectric capacitance undergoes is positive or negative.

The capacitance 100 also comprises heating elements which dissipate a certain amount of heat into the pixels 102, and more specifically into the portion 106 of the pyroelectric material, during reading of the pixels 102. In the embodiment example described here, these heating elements are formed directly by one of the electrodes 108, 110 of each of the pyroelectric capacitances. In the example in FIG. 1, the heating element of the pyroelectric capacitance of the pixel 102 is formed by the upper electrode 110. The other electrode of the pyroelectric capacitance, here lower electrode 108, acts as the reading electrode of the pixel 102.

The heating of the portion 106 of pyroelectric material is achieved by passing a current in the electrode intended to form the heating element. This electrode is also used for the polarisation of the pyroelectric capacitance. Thus the heating resistance for each of the pixels 102 also serve to polarise an electrode of the pyroelectric capacitance formed by the portion 106 and the electrodes 108, 110 of each of the pixels 102 during the measurement made by these pixels 102 (the polarisation applied during a measurement is different to the initial polarisation of the PVDF described earlier).

The use of one of the electrodes 108, 110 of the pixels 102 to form the heating elements is possible due to the fact that the value of the electrical potential applied to this electrode during a reading of the thermal pattern is constant.

Figure 2:
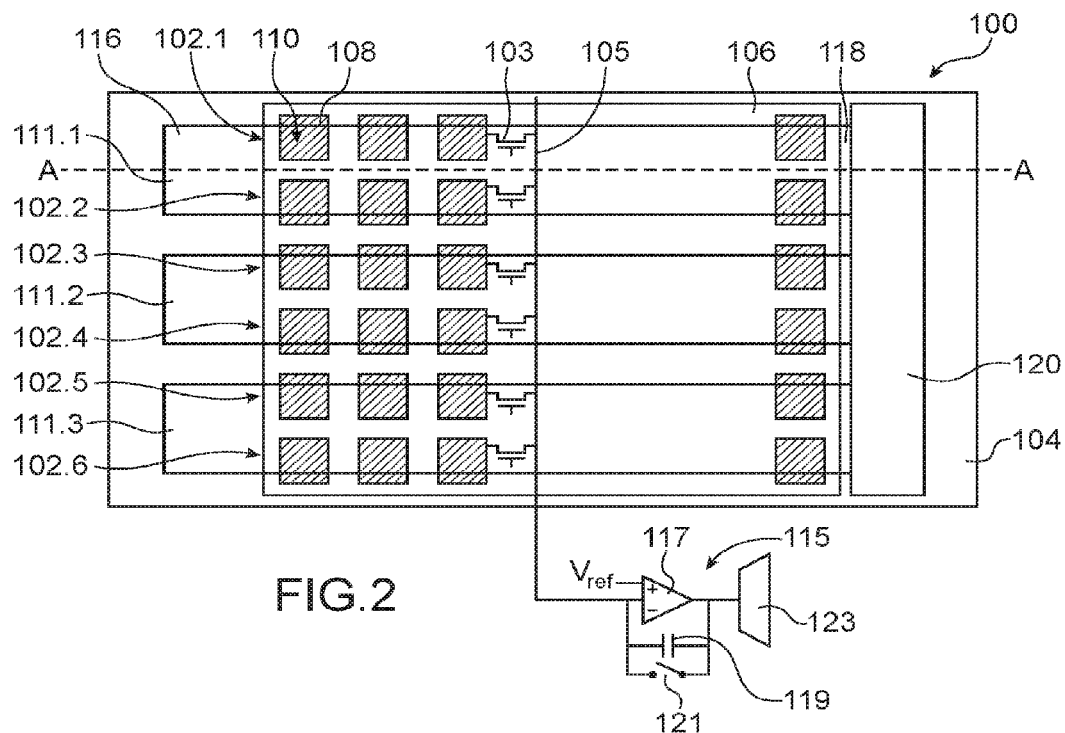
FIGS. 2 to 5 show top views of a part of a thermal pattern sensor according to various embodiments.

FIG. 2 shows a top view of several pixels 102 of the sensor 100 according to a first embodiment.

The lower electrodes 108, which correspond to the reading electrodes of the pixels on which the charges generated by the pyroelectric capacitances are to be recovered in order to be read, are formed by distinct elements of electrically conductive material which are electrically insulated from each other for each pixel 102. These conductive elements each have a rectangular cross-section in the plane of the substrate 104 ((X,Y) plane), and are arranged next to each other in the form of a matrix in order to form the matrix of pixels 102.

The pyroelectric material is made in the form of a single portion 106, or a single layer 106 covering all the lower electrodes 108.

The upper electrodes 110 of the pixels are formed by several electrically conductive portions 111, which are referenced 111.1 to 111.3 in FIG. 2, each forming the upper electrodes 110 of the pixels 102 belonging to at least two adjacent lines of pixels (two adjacent lines of pixels in the example in FIG. 2). Each of the portions 111 comprise a first end 116 to which a heating potential is applied, and a second end 118, connected to another conductive portion 120 which is common to all the portions 111 and connected to ground. The electrical potentials applied to the first ends 116 of the portions 111 are similar from one portion 111 to the other.

Each of the portions 111 is associated with at least two lines of pixels capable of being heated by the portion 111 which is associated with them. In the example in FIG. 2, the portion 111.1 is associated with the lines of pixels 102.1 and 102.2, the portion 111.2 is associated with the lines of pixels 102.3 and 102.4, and the portion 111.3 is associated with the lines of pixels 102.5 and 102.6.

Thus, in this first embodiment, each of the portions 111.*i* form a heating element capable of heating the lines of pixels 102.(2*i*) and 102.(2*i*−1), where i is a whole number between 1 and n/2 (for a sensor 100 comprising n lines of pixels). Each of the portions 111.*i* also forms the upper electrodes 110 of these lines of pixels 102.(2*i*) and 102.(2*i*−1).

A control circuit (not shown in FIG. 2) capable of controlling the switching on and off of the heating elements of the sensor 100, that is, capable of controlling the passage of heating current in the portions 111, comprises, for example, an electrical connection which applies an existing voltage in the sensor 100 to the end 116 of each of the portions 111. For example, if the end 118 of a portion 111 is connected to ground and a heating potential $V_{HEATING}$ is applied to the end 116 of this portion 111, a current then flows from the end 116 to the end 118 of the portion 111, causing Joule effect heating in the portion 111 and thus heating the portions of pyroelectric material of the pixels 102 of the line of pixels heated by this portion 111. The value of the heating voltage is selected depending on the desired heating power, with this power being a function, in particular, of the thickness of the portion 106 that is to be heated as well as of the thickness of the protective layer 109, of the pyroelectric coefficient of the material of the portion 106, of the sensitivity of the reading circuit, of the noise level of the reading circuit and of the integration time. In a pixel 102 the heating power is, for example, between about 0.1 mW and 10 mW.

Advantageously the electrically conductive portions 111 which act as heating resistances of the pixels 102 also form the upper electrodes 110 of the pixels 102 which are arranged above the pyroelectric material and not the lower electrodes 108, since this arrangement allows the conductive portions of the pyroelectric capacitances which are closest to the exterior of the sensor 100 to be connected to the ground of the sensor 100. Such an arrangement forms a protection against electrostatic discharges (ESD), since if such a discharge occurs there is then a preferential path for the electrical charge due to this discharge to flow through. This limits voltage breakdown of the fragile active elements of the sensor 100, such as the transistors.

It is nevertheless possible for the heating elements to be arranged beneath the portion of the pyroelectric material 106 and form lower electrodes 108.

In the embodiment shown in FIG. 2, the portions 111 form conductive bands of uniform width, substantially equal in relation to one other and which each extend along the length of the two lines of pixels 102. The heat is therefore diffused in a uniform manner along the length of each portion 111 which diffuses heat into the two lines of pixels 102 associated with this portion 111.

In order for the heating of each of the two lines of pixels 102 associated with one of the portions 111 to be similar for each of the two lines of pixels 102, each portion 111 is here symmetrical in relation to an axis parallel to the two lines of pixels 102, with this axis being found at a distance which is substantially equal from these two lines of pixels 102. In the example in FIG. 2, the second portion 111.1 is symmetrical relative to the axis AA passing between the two lines of pixels 102.1 and 102.2 and at an equal distance from these two lines of pixels. In other words, the surface areas of the reading electrodes 108 of the pixels 102 facing the electrically conductive portions 111 are substantially equal to each other. Thus the pixels 102 all have an equivalent pyroelectric surface area, and the coverage of the lower electrodes 108 of the two adjacent lines of pixels by the portion 111 forming the upper electrodes of these pixels 102 is the same for both lines of pixels 102.

Alternatively, it is possible to make the sensor 100 such that it comprises an additional electrically conductive portion 111.0 such that the electrically conductive portion 111.1 is arranged between the electrically conductive portion 111.2 and this additional electrically conductive portion 111.0 (which is not arranged above any of the thermo-sensitive measurement elements of the pixels). Similarly, the sensor 100 may comprise another additional portion 111.((n/2)+1) such that the electrically conductive portion 111.(n/2) (in the case of a sensor comprising n lines of pixels) is arranged between the electrically conductive portion 111.((n/2)−1) and this other additional electrically conductive portion 111.((n/2)+1) (which is also not arranged above any thermo-sensitive measurement element of the pixels). This variant allows all the pixels 102 of the sensor 100 to be arranged in a similar heating environment.

During the reading of a line of pixels, the electrical potential $V_{HEATING}$ applied to one of the electrodes of the pyroelectric capacitances is constant throughout the reading of a pixel. On the other hand, due to the fact that the electrically conductive portion 111 to which this potential is applied is common to several pixels 102, the value of the heating potential applied to one of the electrodes of the pyroelectric capacitances of each of the pixels 102 differs from pixel to another. Considering a line of pixels of the sensor 100 shown in FIG. 2, the upper electrode 110 of the pyroelectric capacity closest to the end 116 is subjected to a potential which is substantially equal to $V_{HEATING}$. The upper electrode 110 of the next pyroelectric capacitance is subjected to an electric potential substantially equal to $V_{HEATING}-\delta V$. The values of the electrical potential applied to the upper electrodes 110 of the pyroelectric capacitances decreases proportionally with their distance from the end 116. When the conductive portion 120 is connected to ground, the upper electrode 110 of the last pyroelectric capacitance, which corresponds to that adjacent to the conductive portion 120, is subjected to an electrical potential which is substantially equal to 0V, that is, the electrical potential of ground. This variation between one pixel and another of the heating electrical potential applied does not modify the heating produced from one pixel to another due to the fact that the current flowing in the electrically conductive portion 111 which causes heating is the same throughout the electrically conductive portion 111 and is the same for all the pixels 102, since the heating resistances for all the pixels 102 are the same.

On reading the pixels of the line being read, the potential values on each electrode differ from one pixel to another. On the other hand, for a given temperature variation, the voltage difference, or difference in number of charges generated at the terminals of the pyroelectric capacitances is the same. It is these excess charges generated relative to the reference voltage that are read, whether positive or negative.

Each of the pixels 102 comprise at least one selection transistor 103 (in FIG. 2, only the selection transistors 103 of a single column of pixels 102 are shown), and the selection transistors 103 of the pixels 102 of each column of pixels 102 are connected to a reading column 105 (in FIG. 2 a single reading column 105 associated with a column of pixels 102 is shown) itself connected to a reading circuit 115 (in FIG. 2 a single reading circuit 115 associated with a column of pixels 102 is shown). During reading of a line of pixels 102, the selection transistors 103 of the pixels 102 of this line are set to an ON state, which allows active nodes of the pixels 102 of this line to be connected to the reading circuits 115 located at the end of each of the columns of pixels 102. The non-conducting selection transistors 103 of the pixels 102 belonging to the other lines of pixels 102 prevent the movement of charge from these other pixels 102 to the reading circuits. Other transistors may also be present in each pixel 102, in particular when the pixels' 102 voltages are read, and they require a re-initialisation transistor and a voltage follower transistor to be present, or when the sensor 100 also forms an optical sensor in which a transistor is present in each pixel 102 to connect a photodiode of each pixel 102 to a dedicated reading circuit.

In FIG. 2, the input to the reading circuit 115 to which the reading column 105 is connected corresponds to the inverting input of a reading amplifier 117. This reading amplifier 117 here corresponds to an operational amplifier. An electrical polarisation potential $V_{ref}$ is applied to the non-inverting input of the amplifier 117. The output of the amplifier 117 is looped to its inverting input by means of a capacitance 119. A switch 121, or throw-switch, is connected in parallel to the capacitance 119, and is used to short-circuit the capacitance 119 during re-initialisation of the reading circuit 115. The output from the reading amplifier 117 is also connected to the input to an analogue/digital converter 123. The reading amplifier 117, the capacitance 119, the switch 121 and the analogue/digital converter 123 are here common to all the pixels 102 in a given column. The analogue/digital converter 123 may be common to all the columns of pixels 102 of the sensor 100, allowing the addition of electronic multiplexing elements between the outputs from the reading amplifiers 117 associated with the various columns of pixels and the analogue/digital converter 123.

The electronic elements which form the reading circuits 105 may be made on a substrate which is different to that upon which the pixels 102 are made, where these substrates may subsequently be assembled together. Thus the electronic elements of these reading circuits may be made using a manufacturing technology (for example CMOS) which is different from that used to create the pixels 102 (for example by printing).

In the sensor 100 according to the first embodiment shown in FIG. 2, the portions 111 are not arranged completely opposite the lower electrodes 108. For each line of pixels 102, parts of the lower electrodes 108 of this line of pixels 102 are not arranged facing the portion 111 associated with this line of pixels 102.

Figure 3:
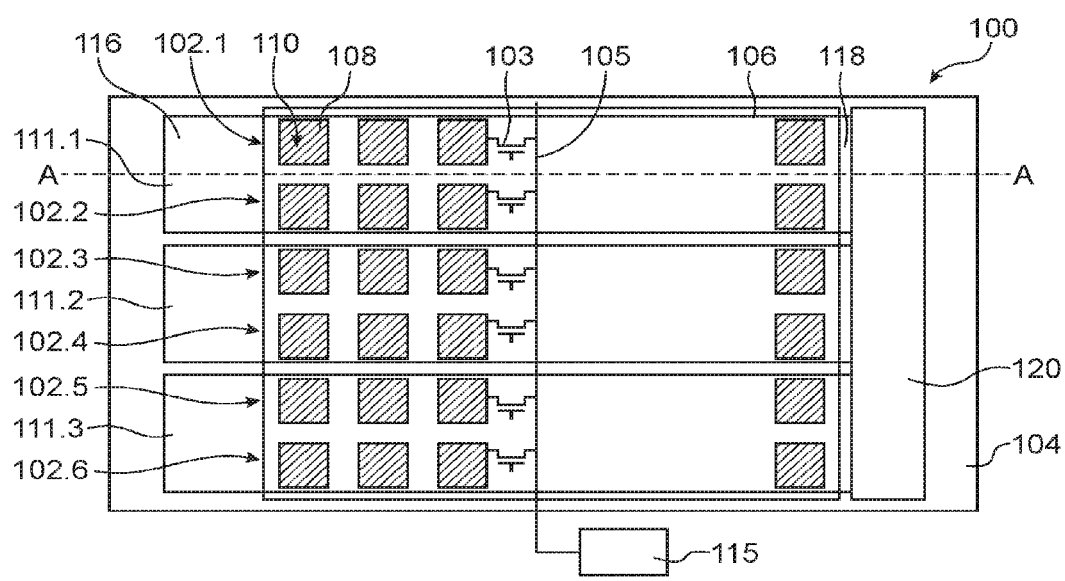

FIG. 3 shows the sensor 100 according to one alternative of this first embodiment, in which the electrically conductive portions 111 completely cover the lower electrodes. Thus for each line of pixels 102, the entire surface area (in the plane parallel to the substrate 104) of the lower electrodes 108 of this line of pixels 102 is arranged facing the second portion 111 associated with this line of pixels 102.

The reading of the pixels 102 of the sensor 100 shown in FIG. 2 or in FIG. 3 can be achieved in different ways.

For example, it is possible to read the different lines of pixels 102 sequentially, starting with the first line of pixels 102.1 and ending with the last line of pixels 102.$n$. In this case, given that each of the electrically conductive portions 111 perform heating of two lines of pixels 102, it is necessary to introduce, between successive readings of two lines of pixels 102 heated by a given portion 111, a waiting time allowing the line of pixels that are heated but not being read to cool before they are read. This waiting time may be of the order of 3 to 5 times the heating time used in order to read a line of pixels 102.

Advantageously, it is possible to first of all carry out reading of the odd lines of pixels (102.1, 102.3 etc.), then reading of the even lines of pixels (102.2, 102.4 etc.). Thus it is not necessary to apply a waiting time between two successive readings of lines of pixels, since during the reading of one of the lines of pixels, the line of pixels that is to be read immediately after is not subjected to the heating of the line of pixels that is being read.

In this case the reading sequence carried out may be as follows:
- selection of line 102.1 of pixels that are to be read, for example by setting the selection transistors 103 of the pixels of line 102.1 to an ON state;
- switching on the heating element associated with the lines of pixels 102.1 and 102.2 via the application of a heating voltage to the portion 111.1;
- re-initialisation of the reading circuits 115 coupled to all the columns of pixels 105 (with this re-initialisation being performed after the start of heating in order to avoid the introduction of undesirable noise into the reading circuits 115 at the moment the heating is switched on);
- start of integration of the pixels of line 102.1;
- waiting during the integration time $\zeta$, for example equal to 1 ms;
- reading of the signals received by the reading circuits 115, which correspond to the variations in the temperature measured by the pixels in line 102.1 which is being read;
- switching off the heating element;
- de-selection of the line 102.1.

The line of pixels 102.3 is then read by switching on the heating of this line of pixels 102.3 via the portion 111.2, then the line of pixels 102.5, etc. After carrying out the reading of odd lines of pixels, the even lines of pixels are read, starting, for example, with the line of pixels 102.2 with which the portion 111.1 is associated, then the line of pixels 102.4 etc.

Alternatively it is possible to begin by reading the even lines of pixels, then reading the odd lines of pixels.

In general, orders of reading of the lines of pixels 102 which differ from those described may be envisaged. It is nevertheless preferable not to read two lines of pixels 102 associated with the same heating element 111 successively, in order to avoid having to comply with the requirement for a waiting time in order for the line of pixels that are heated but which are not being read to cool.

In order to improve the heating of the lines of pixels, the sensor 100 may, during the reading of one of the lines of pixels 102, carry out heating of the heating element associated with the line of pixels being read, together with that of the heating element located above or below the heating element associated with the line of pixels being read. Thus in the example in FIG. 2, during reading of the second line of pixels 102.2, non-zero heating voltages may be applied to the terminals of the second portion 111.1 which is associated with the second line of pixels 102.2 as well as to the terminals of the second portion 111.2 which is associated with the two lines of pixels 102.3 and 102.4. According to another example, during the reading of the line of pixels 102.3, heating voltages may be applied to the terminals of the second portions 111.1 and 111.2.

Thus, by carrying out greater heating of pixels during their reading, a larger reading signal may be obtained. In this case it is preferable to carry out successive readings of non-adjacent pixels lines, for example in this order the lines 102.1, 102.3, 102.5, etc., or even 102.1, 102.5, 102.9 etc., in order to avoid waiting during a cooling period for the lines of pixels being heated.

A larger number of heating elements may be switched on during the reading of a line of pixels of the sensor 100. Furthermore the heating currents introduced into the various heating elements are not necessarily similar.

Moreover, the heating currents introduced into the different heating elements may be altered depending on any heating previously carried out for one or more heating elements during an earlier reading of a line of pixels. Thus, for a heating element which has been used for reading an earlier line of pixels, the latter is already hot and therefore requires less heating power than that used for a heating element not used for reading the earlier line of pixels. In this case the integration of pixels to be read has already begun.

A heating element which is not associated with the line of pixels being read may also have a heating current passing through it during the reading of this line of pixels, with the aim of carrying out pre-heating of this heating element which is to be used for reading of the following line of pixels.

In general the integration time $\zeta$ is between about 30 μs and 1 ms in order to achieve a temperature variation of between about 0.5 K and 0.05 K.

Whether the reading is made in terms of charge (or current) or voltage, the switching on and off of the heating is preferably not performed during the integration time $\zeta$ and reading time. In effect, switching on the heating causes significant variation in the potential of one of the electrodes in the pyroelectric capacitances of the pixels being read. This variation therefore occurs at the other electrode of the pyroelectric capacitances being read. This variation in potential is, for certain pixels, significantly greater than the signal that is to be read by these pixels. For the same reason all interferences to the potential $V_{HEATING}$ during the integration, in particular those associated with current demand due to the operation of other electronic parts of the sensor 100, should be minimised as much as possible.

In the first embodiment described earlier, each of the portions 111 is capable of heating two adjacent lines of pixels 102. Alternatively, it is possible for each of the portions 111 to be capable of heating more than two adjacent lines of pixels 102. Thus, considering the sensor 100 shown in FIG. 2 or FIG. 3, it is possible, for example, to have a single portion 111.1 which forms the upper electrodes and the heating elements of the three lines of pixels 102.1-102.3, or again four lines of pixels 102.1-102.4, or an even greater number of lines of pixels. For lines of pixels located at the edges of the portions 111, any differences produced in the reading signals in comparison with the other lines of pixels may be compensated for by subsequent calculations.

Figure 4:
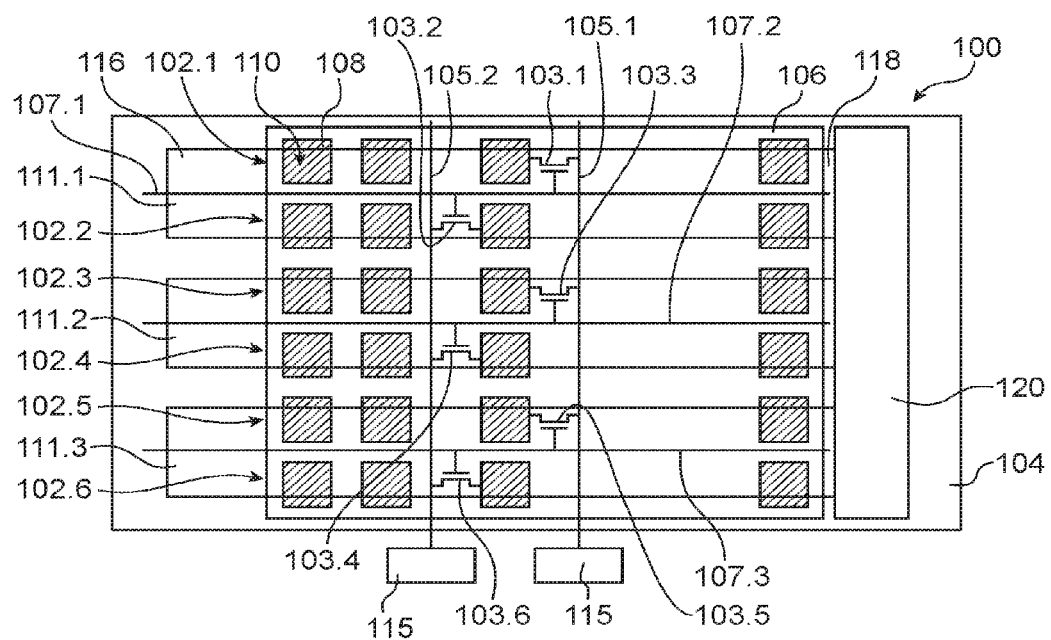

FIG. 4 shows the sensor 100 according to a second embodiment.

In this second embodiment the selection transistors 103 associated with the pixels of a given column are not connected to a single reading column 105 but to two reading columns 105.1 and 105.2 such that a portion of the pixels 102 of one column are connected to one of the two reading columns 105.1 and such that the other pixels 102 of this column are connected to the other of the two reading columns 105.2. In the example in FIG. 4, the selection transistors for the odd lines of pixels (transistors 103.1, 103.3, and 103.5) are connected to a first reading column 105.1 and the selection transistors for the even lines of pixels (transistors 103.2, 103.4 and 103.6) are connected to a second reading column 105.2. Thus the sensor 100 according to this second embodiment comprises a number of reading columns 105, and therefore also a number of reading circuits 115, corresponding to double that of the sensor 100 according to this first embodiment.

The sensor 100 according to this second embodiment allows simultaneous reading to be carried out on two lines of pixels 102, advantageously heated by the same portion 111. Advantageously the gates of the selection transistors 103 of the two lines of pixels to be read simultaneously are connected to a single selection line 107 which can be used to render the selection transistors 103 of these two lines of pixels conducting during reading of the two lines of pixels.

In this case the reading sequence carried out is as follows:
  selection of lines 102.1 and 102.2 of pixels to be read by
    setting the selection transistors 103 (the transistors
    103.1 and 103.2 in the example in FIG. 4) of the pixels
    in lines 102.1 and 102.2 to an ON state;
  switching on the heating element associated with the lines
    of pixels 102.1 and 102.2 via the application of a
    heating voltage to the portion 111.1;
  re-initialisation of the reading circuits 115 coupled to all
    the columns of pixels (this re-initialisation being carried out after the start of heating in order to avoid
    introducing undesirable noise into the reading circuits
    at the moment that heating is switched on);
  start of integration of the pixels of lines 102.1 and 102.2;
  waiting during the integration time $\zeta$, for example equal
    to 1 ms;
  reading of the signals received by the reading circuits 115,
    which correspond to the variations in the temperature
    measured by the pixels in lines 102.1 and 102.2 which
    are being read;
  switching off the heating element;
  de-selection of lines 102.1 and 102.2.

This reading sequence is repeated for each following group of two lines of pixels with which one of the portions 111 is associated.

In this second embodiment, it is possible for the even and odd lines of pixels to have different behaviours depending on the arrangement of the transistors within the pixels.

In the previously described embodiments of the sensor 100, the heating elements are formed from the same electrically conductive level as that used to form the upper electrodes of the pyroelectric capacitances of the pixels, with the portions 111 forming both the heating elements and the upper electrodes of the pixels 102.

Alternatively it is possible that the heating elements are not formed from the same electrically conductive level as that used to make the upper electrodes. In this case the portions 111 and the upper electrodes 110 correspond to distinct elements.

Alternatively, it is possible that the portions 111 which form the heating elements of the pixels are covered with a dielectric layer, itself covered with an electrically conductive layer which is electrically connected to ground. This electrically conductive layer may be covered by the protective layer 109. This electrically conductive layer comprising, for example, an electrically conductive ink, thus forms an electromagnetic shield between the element whose thermal pattern is being detected, for example a finger in the case of a fingerprint detector 100, and the portions 111 forming the polarisation electrodes of each pixel 102, thus avoiding recovery of the electromagnetic noise (for example noise at 50 Hz from the mains supply) in the measurements made. This electrically conductive layer is also used to protect the sensor 100 against electrostatic discharge (ESD).

Advantageously, in comparison with the previous embodiment alternative wherein the electrically conductive layer forming the electromagnetic shield layer is arranged above the pyroelectric capacitances, this layer of electromagnetic shielding may be arranged directly above the pyroelectric material. This electromagnetic shielding layer is covered with a dielectric layer upon which the portions 111 forming the heating elements are arranged. In this configuration the heating elements are arranged as close as possible to the element whose thermal pattern is being detected by the sensor 100.

In FIG. 4 the electrically conductive layer forming such shielding is designated as reference 112.

The thermal pattern detected by the sensor 100 advantageously corresponds to a fingerprint.

Although not shown, the sensor 100 may moreover comprise an electronic processing circuit capable of constructing a global image of the thermal pattern from the measurements made at each pixel 102. This electronic processing circuit may also be capable of comparing this image with several images stored in a database in order to identify whether the detected thermal pattern corresponds to one of those stored in the database. The electronic processing circuit may also be capable of displaying an image of the thermal pattern detected.

In the previously described embodiments, the portions 111 are heated one by one, by applying a suitable electrical potential to the end 116 of the portion 111 and by connecting the end 118 of this portion 111 to ground via the portion 120 to which the ends 118 of all the second portions 111 are connected. Alternatively, it is possible not to connect the end 118 of the heated portion 111 to ground, but to connect the ends 116 of the other portions 111 to ground. For example by considering the sensor in FIG. 2, during reading of the line of pixels 102.1 or 102.2, a heating potential is applied to the end 116 of the portion 111.1 and the ends 116 of the portion 111.1 and the ends 116 of the other portions 111 (portions 111.2 and 111.3 in the example in FIG. 2) are connected to the ground.

Thus the heating current passes first of all through the portion 111.1 then the other portions 111 of the sensor are used to pass the current to ground. The other portions 111 are therefore also subjected to heating, but when the sensor 100 comprises a large number of lines of pixels, for example about a hundred, the current is divided into all these other portions 111 which makes the heating in these other portions 111 negligible in comparison with that achieved by the portion 111.1. This amounts to the addition of an average signal (the same for all lines) in addition to the signal from the line of pixels being read, which is equivalent to simply offsetting the value being read. This possibility of using the conductive portions associated with the lines of pixels not being read in order to remove the heating current can be applied to other types of sensors, for example to a sensor wherein each second portion 111 is only associated with a single line of pixels.

Figure 5:
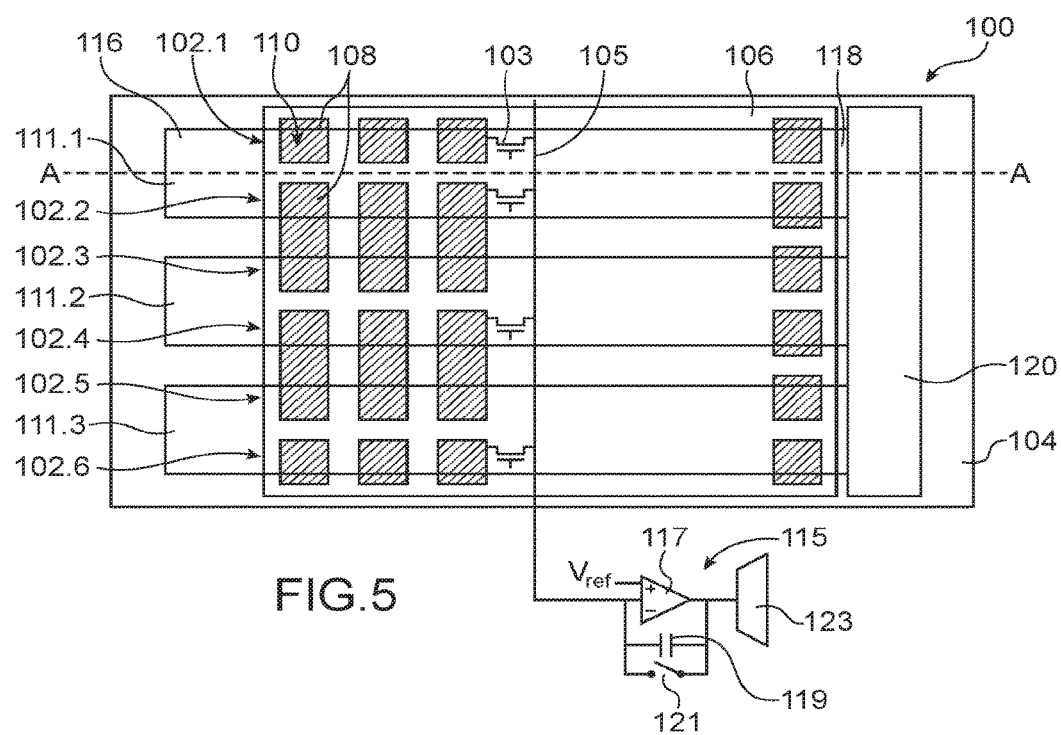

FIG. 5 shows the sensor 100 according to a third embodiment.

In comparison with the previous embodiments, and for at least some of the lines of pixels 102 of the sensor 100, each of the reading electrodes 108 of these lines of pixels 102 is not distinct for each of the pixels 102, but is common to two pixels from a given column and which are heated by different portions 111. Thus for two adjacent lines of pixels each of which is associated with a different portion 111, the reading electrodes of two pixels found in a given column are electrically connected together due to the fact that they are formed by the same portion of the electrically conductive material. In the example shown in FIG. 5, the reading electrodes of the pixels of a given column, and which belong to two lines of pixels 102.2 and 102.3, each associated with a different heating element (the heating elements of the line of pixels 102.2 being formed by the portion 111.1 and those of the line of pixels 102.3 being formed by the portion 111.2) are formed by the same portion of the electrically conductive material. Similarly, the reading electrodes of the pixels of a given column and which belong to two lines of pixels 102.4 and 102.5, each associated with a different heating element (the heating elements of the line of pixels 102.4 being formed by the portion 111.2 and those of the line of pixels 102.5 being formed by the portion 111.3) are formed by the same portion of the electrically conductive material.

Compared with the previously described first and second embodiments, this rendering of the reading electrodes in common reduces the number of selection transistors 103 required, due to the fact that a single selection transistor 103 is associated with each of the portions forming the reading electrodes of at least two pixels. Considering two lines of pixels whose reading electrodes are formed, for each column, by a single electrically conductive portion, a single line of selection transistors 103 is necessary to perform the reading of these two lines of pixels. Moreover, the reduction of the number of selection transistors 103 also implies, when compared with the first embodiment, a reduction in the number of selection lines 107 which are connected to the gates of the selection transistors 103.

Finally, the reading of the pixels of this sensor 100 according to the third embodiment is implemented in a manner that is analogous to that described previously for the first embodiment.

The invention claimed is:

1. A thermal pattern sensor, comprising:
a matrix of several lines and columns of pixels, each pixel comprising
at least one pyroelectric capacitance formed by at least one portion of pyroelectric material arranged between a lower electrode and an upper electrode,
wherein one of the lower and upper electrodes forms a reading electrode of said each pixel; and
a plurality of electrically conductive portions, each electrically conductive portion being:
configured for Joule effect heating, independently of other electrically conductive portions of said plurality, of the at least one portion of pyroelectric material of the at least one pyroelectric capacitance of pixels of at least two adjacent lines of pixels associated with said each electrically conductive portion, and arranged facing at least a part of a surface of the reading electrode of each of the pixels of the at least two adjacent lines of pixels associated with said each electrically conductive portion.

2. The thermal pattern sensor according to claim 1, wherein each of the electrically conductive portions is arranged facing an entire surface area of the reading electrode of said each of the pixels of the at least two adjacent lines of pixels associated with said each electrically conductive portion.

3. The thermal pattern sensor according to claim 1, wherein each of the electrically conductive portions is arranged facing a part of the surface of the reading electrode of said each of the pixels of the at least two adjacent lines of pixels associated with said each electrically conductive portion, where surface areas of the reading electrodes of the pixels located facing electrically conductive portions are substantially equal to each other.

4. The thermal pattern sensor according to claim 1, wherein:
said each pixel further comprises a selection transistor connected to the reading electrode of said each pixel,
for each line of pixels, gates of selection transistors of the pixels of said each line of pixels are connected to a selection line of said each line of pixels, and
for each column of pixels, selection transistors of the pixels of said column of pixels are connected to a reading column of said column of pixels, which is connected to a reading circuit common to the pixels of said column of pixels.

5. The thermal sensor according to claim 4, further comprising a control circuit configured to implement, for reading a line of pixels, at least the following steps:
setting the selection transistors of the pixels of said line to an ON state;
application of a heating voltage to ends of the electrically conductive portion associated with said line of pixels;
re-initialisation of the reading circuit;
waiting, during an integration time, which corresponds to a measurement of a thermal pattern by the pixels of said line;
reading of a quantity of electric charge received by the reading circuit; and
setting the selection transistors of the pixels of said line to an OFF state.

6. The thermal pattern sensor according to claim 5, wherein the control circuit is further configured to control successive reading of several lines of pixels such that two lines of pixels read successively are associated with different electrically conductive portions.

7. The thermal pattern according to claim 1, wherein electrodes for reading the pixels of a given column and which belong to two adjacent lines of pixels associated with different electrically conductive portions are electrically connected to each other.

8. The thermal pattern sensor according to claim 1, wherein:
each pixel further comprises a selection transistor connected to the reading electrode of said pixel,
gates of the selection transistors of the pixels, which belong to adjacent lines of pixels configured to be heated simultaneously by a given electrically conductive portion are connected to a single common selection line of said lines of pixels, and
for each column of pixels, the selection transistors whose gates are connected to a same selection line are connected to different reading columns each connected to a different reading circuit.

9. The thermal pattern sensor according to claim 8, further comprising a control circuit configured to implement at least the following steps for simultaneous reading of adjacent lines of pixels configured to be heated simultaneously by a given electrically conductive portion:
setting the selection transistors of the pixels of said lines of pixels to an ON state;
application of a heating voltage to ends of the electrically conductive portions associated with said lines of pixels;
re-initialisation of the reading circuit;
waiting, during an integration time, which corresponds to a measurement of a thermal pattern by the pixels of said lines of pixels;
reading of a quantity of electric charge received by the reading circuit;
setting the selection transistors of the pixels of said lines of pixels to an OFF state; and
ceasing application of the heating voltage to the ends of the electrically conductive portions associated with said lines of pixels.

10. The thermal pattern sensor according to claim 5, wherein, during the reading of a line of pixels, the control circuit is further configured to apply at least one second non-zero heating voltage to ends of at least one electrically conductive portion adjacent to the electrically conductive portion associated with the line of pixels being read.

11. The thermal pattern sensor according to claim 9, wherein, during the reading of a line of pixels, the control circuit is further configured to apply at least one second non-zero heating voltage to ends of at least one electrically conductive portion adjacent to the electrically conductive portion associated with the line of pixels being read.

12. The thermal pattern sensor according to claim 1, further comprising a substrate upon which the pyroelectric capacitances of the pixels are arranged, where the lower electrode of the pyroelectric capacitance of each pixel forms the reading electrode of the pixel and is arranged between the substrate and the portion of the pyroelectric material of the pyroelectric capacitance of the pixel.

13. The thermal pattern sensor according to claim 12, wherein the electrically conductive portions form the upper electrodes of the pyroelectric capacitances of the pixels.

14. The thermal pattern sensor according to claim 1, further comprising a dielectric layer covering the upper electrode of said each pixel of the matrix, and a first electrically conductive layer arranged on said dielectric layer and forming an electromagnetic shield of the sensor.

15. The thermal pattern sensor according to claim 12, wherein the upper electrodes of the pyroelectric capacitances of the pixels are formed by a second electrically conductive layer common to all the pixels in the matrix, configured to be electrically connected to a reference electrical potential and arranged between the electrically conductive portions and the reading electrodes.

16. A method for making a thermal pattern sensor according to claim 1, wherein the electrically conductive portions are made by printing.

* * * * *